(12) United States Patent
Kanatake

(10) Patent No.: US 8,143,637 B2
(45) Date of Patent: Mar. 27, 2012

(54) OPTICALLY COUPLED DEVICE WITH AN OPTICAL WAVEGUIDE

(75) Inventor: Mitsuhito Kanatake, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 128 days.

(21) Appl. No.: 12/652,806

(22) Filed: Jan. 6, 2010

(65) Prior Publication Data

US 2010/0171127 A1    Jul. 8, 2010

(30) Foreign Application Priority Data

Jan. 8, 2009  (JP) ................................. 2009-002459

(51) Int. Cl.
*H01L 33/00*  (2010.01)

(52) U.S. Cl. .......... 257/98; 257/100; 257/432; 257/433; 257/25.032

(58) Field of Classification Search .................. None
See application file for complete search history.

(56) References Cited

U.S. PATENT DOCUMENTS

| | | | | |
|---|---|---|---|---|
| 5,751,009 A | * | 5/1998 | Anderson et al. | 250/551 |
| 7,021,839 B2 | * | 4/2006 | Ho | 385/92 |
| 7,748,912 B2 | * | 7/2010 | Ho et al. | 385/92 |
| 7,847,301 B2 | * | 12/2010 | Ives et al. | 257/82 |
| 2004/0100192 A1 | * | 5/2004 | Yano et al. | 313/512 |

FOREIGN PATENT DOCUMENTS

| | | |
|---|---|---|
| JP | 06-037352 | 2/1994 |
| JP | WO 96/36900 | 11/1996 |
| JP | 2000-040839 | 2/2000 |

* cited by examiner

*Primary Examiner* — Alonzo Chambliss
(74) *Attorney, Agent, or Firm* — Young & Thompson

(57) ABSTRACT

An optically coupled device includes a light emitting element and a light receiving element which are electrically isolated from each other, and an optical waveguide allowing therethrough transmission of light from the light emitting element to the light receiving element, wherein the optical waveguide is covered with an encapsulation resin containing a light reflective inorganic particle which is typically composed of titanium oxide, the light emitting element and the light receiving element are respectively provided on a base (for example, package terminals), and the entire portion of the outer surface of the optical waveguide, brought into contact with none of the light emitting element, the light receiving element and the base, is covered with the encapsulation resin.

10 Claims, 5 Drawing Sheets

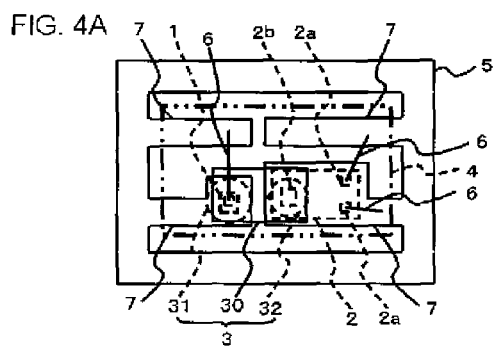
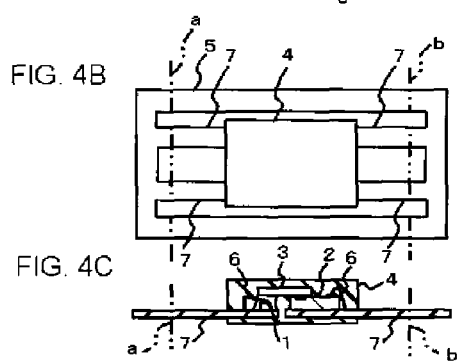
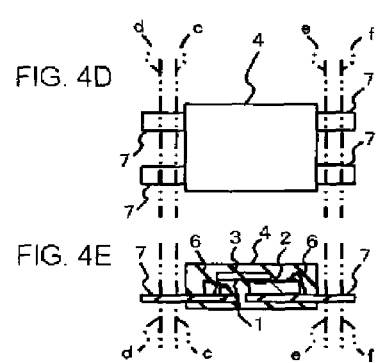
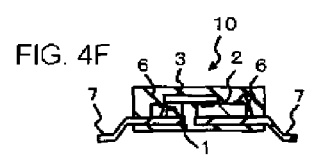

OPTICALLY COUPLED DEVICE WITH AN OPTICAL WAVEGUIDE

This application is based on Japanese patent application No. 2009-002459 the content of which is incorporated hereinto by reference.

BACKGROUND

1. Technical Field

The present invention relates to an optically coupled device and a method of manufacturing the same.

2. Related Art

Optically coupled device has a light emitting element which accepts input of electric signals, a light receiving element which outputs electric signals, and an optical waveguide allowing therethrough transmission of optical signals from the light emitting element to the light receiving element.

The optically coupled device may be exemplified by those disclosed in Published Japanese Translation of PCT International Publication for Patent Application No. H09-510835, Japanese Laid-Open Patent Publication No. H06-37352, and Japanese Laid-Open Patent Publication No. 2000-40839.

The optically coupled device of Published Japanese Translation of PCT International Publication for Patent Application No. H09-510835 has, as illustrated in FIG. 7, a light emitting element 101, a light receiving element 102, a light-transmissive flat waveguide 103 as an optical waveguide which allows therethrough transmission of optical signals from the light emitting element to the light receiving element, a plurality of holographic elements 104 for reflecting light (g, h, i), provided along the waveguide 103, and a package 105 which covers these components. This publication describes that "the package 105 is unnecessarily composed of a reflective material, since the light is reflected only on the holographic elements 104, and there is no need of refection of light on the interface between the waveguide 103 and the package 105".

Japanese Laid-Open Patent Publication No. H06-37352 discloses, as illustrated in FIG. 11 of the Publication, an optically coupled device configured to have a light emitting element and a light receiving element, which are disposed in an insulating cup-like case and encapsulated by a light-transmissive encapsulation layer (equivalent to an optical waveguide), a light-transmissive optical waveguide plate disposed on the light-transmissive encapsulation layer, and a light interceptor which covers the light-transmissive optical waveguide plate and the light-transmissive encapsulation layer. In the optically coupled device of the Publication, a reflective surface, which is formed by plating or by printing of a highly-reflective resin, is provided to the lower surface of the light interceptor (the surface opposed to the upper surface of the light-transmissive optical waveguide plate).

The optically coupled device of Japanese Laid-Open Patent Publication No. 2000-40839 is configured as illustrated in FIG. 1 of the Publication, so that a light emitting element and a light receiving element are opposed so as to optically couple with each other, an inert gas is filled in a hollow component which surrounds the light emitting element and the light receiving element opposed as described in the above, and the outer circumference of the hollow component is molded by a light-intercepting resin. In the optically coupled device, the inner space of the hollow component behaves as an optical waveguide.

The technique disclosed in Published Japanese Translation of PCT International Publication for Patent Application No. H09-510835 is necessarily provided with the expensive holographic elements 104, and is therefore suffering from a problem such that the material cost is high, or such that it is difficult to provide the optically coupled device at a low price.

The technique disclosed in Japanese Laid-Open Patent Publication No. H06-37352 needs preliminary formation of the plated layer or the resin layer on the light interceptor, and consequently needs an increased number of steps of manufacturing. Therefore, a problem of difficulty in providing the optically coupled device at a low price remains.

In recent years, there has been a growing trend of downsizing of various equipment, such as those for FA (Factory Automation). In association with the trend, there have been growing demands of downsizing and thinning also on the semiconductor components (including optically coupled devices) mounted thereon. The technique disclosed in Japanese Laid-Open Patent Publication No. 2000-40839 is, however, suffering from a problem in that thinning of the optically coupled device is difficult, because the hollow space is necessarily formed between the light emitting element and the light receiving element opposed to each other.

As described in the above, it has been difficult to provide thin optically coupled devices at low costs.

SUMMARY

According to the present invention, there is provided an optically coupled device which includes: a light emitting element and light receiving element electrically isolated from each other; an optical waveguide allowing therethrough transmission of light from the light emitting element to the light receiving element; and a resin which covers at least a part of the outer surface of the optical waveguide and contains a light reflective inorganic particle.

According to the optically coupled device, the optical waveguide is covered with the resin containing the light reflective inorganic particle, so that light may desirably transmitted from the light emitting element through the optical waveguide to the light receiving element.

The optically coupled device may now be provided at a low price, as compared with the optically coupled device having expensive holographic elements. In addition, since the number of manufacturing steps may be reduced, as compared with manufacturing of the optically coupled device configured to have the optical waveguide covered with the light interceptor which has the plated layer or the resin layer preliminarily formed thereon, so that the optically coupled device of the present invention may more readily be manufacturable, and thereby the optically coupled device may be provided again at a low price. The optically coupled device of the present invention may also be thinned as compared with the conventional one having the light emitting element and the light receiving element opposed to each other, while keeping a hollow space therebetween. In short, according to the present invention, it is now possible to provide a thin optically coupled device at a low price.

According to the present invention, there is provided also a method of manufacturing an optically coupled device which includes: a first step providing an optical waveguide allowing therethrough transmission of light from a light emitting element to a light receiving element which are electrically isolated from each other, and a second step covering the optical waveguide with a resin containing the light reflective inorganic particle, which are carried out in this order.

According to the present invention, it is now possible to provide a thin optically coupled device at a low price.

BRIEF DESCRIPTION OF THE DRAWINGS

The above and other objects, advantages and features of the present invention will be more apparent from the following description of certain preferred embodiments taken in conjunction with the accompanying drawings, in which:

FIGS. 4A to 4F are drawings for explaining the manufacturing steps as continued from the step illustrated in FIG. 3D;

DETAILED DESCRIPTION

Figure 1:
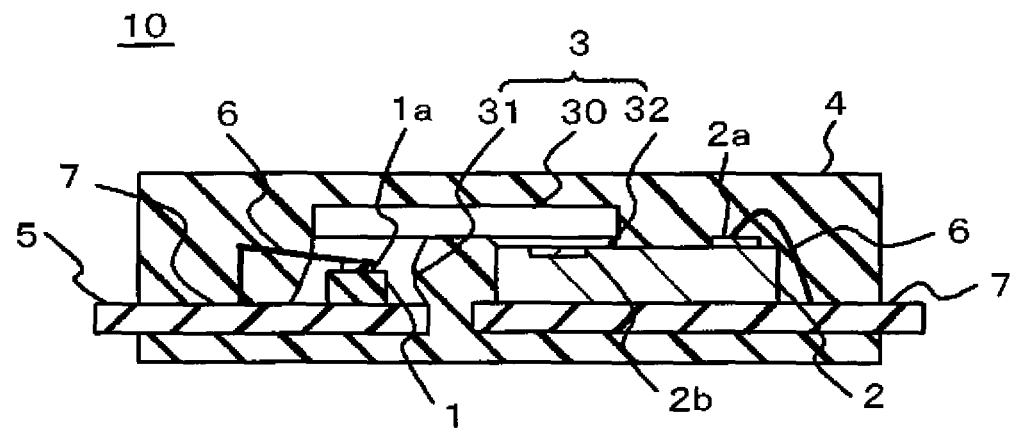
FIG. 1 is a sectional view illustrating an optically coupled device according to one embodiment.

The invention will now be described herein with reference to illustrative embodiments. Those skilled in the art will recognize that many alternative embodiments can be accomplished using the teachings of the present invention and that the invention is not limited to the embodiments illustrated for explanatory purposes.

Embodiments of the present invention will be explained below, referring to the attached drawings. Note that any similar constituents will be given with the same reference numerals or symbols in all drawings, and explanations therefor will not be repeated.

Figure 2:
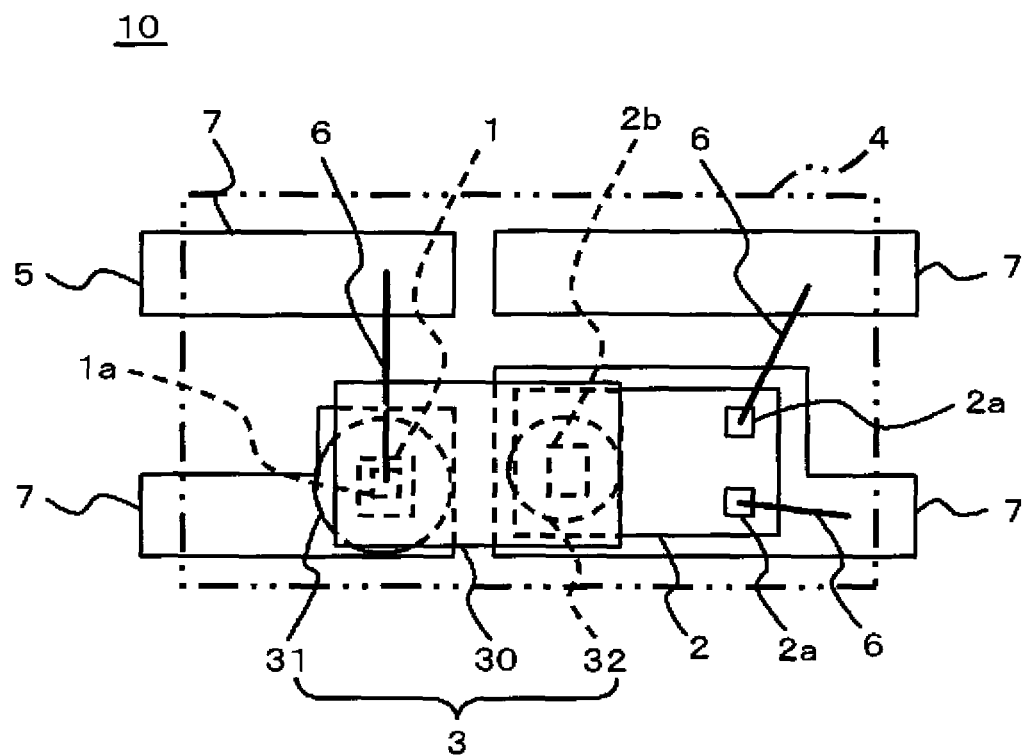
FIG. 2 is a plan view illustrating the optically coupled device according to one embodiment.

FIG. 1 is a sectional view illustrating an optically coupled device 10 according to one embodiment, and FIG. 2 is a plan view of the optically coupled device 10. In FIG. 2, an encapsulation resin 4 is outlined by a virtual line (two dot-dashed line) so as to allow seeing through the encapsulation resin 4.

The optically coupled device 10 of this embodiment has a light emitting element 1 and a light receiving element 2 which are electrically isolated from each other, an optical waveguide 3 which allows therethrough transmission of light from the light emitting element 1 to the light receiving element 2, and a resin containing the light reflective inorganic particle (encapsulation resin 4) which covers at least a part of the outer surface of the optical waveguide 3. In a method of manufacturing the optically coupled device according to this embodiment, a first step providing the optical waveguide 3 allowing therethrough transmission of light from the light emitting element 1 to the light receiving element 2 which are electrically isolated from each other, and a second step covering the optical waveguide 3 with the resin containing the light reflective inorganic particle (encapsulation resin 4), are carried out in this order. This embodiment will be detailed below.

First, a configuration of the optically coupled device 10 will be explained.

As illustrated in FIG. 1 and FIG. 2, the optically coupled device 10 of this embodiment has the light emitting element 1 and the light receiving element 2 which are electrically isolated from each other, the optical waveguide 3 which allows therethrough transmission of light from the light emitting element 1 to the light receiving element 2, and the encapsulation resin 4 which covers the optical waveguide 3.

The encapsulation resin 4 is, as detailed later, composed of an insulating resin containing a light reflective inorganic particle, and behaves to confine light which transmits through the optical waveguide 3 thereinto.

Figure 6:
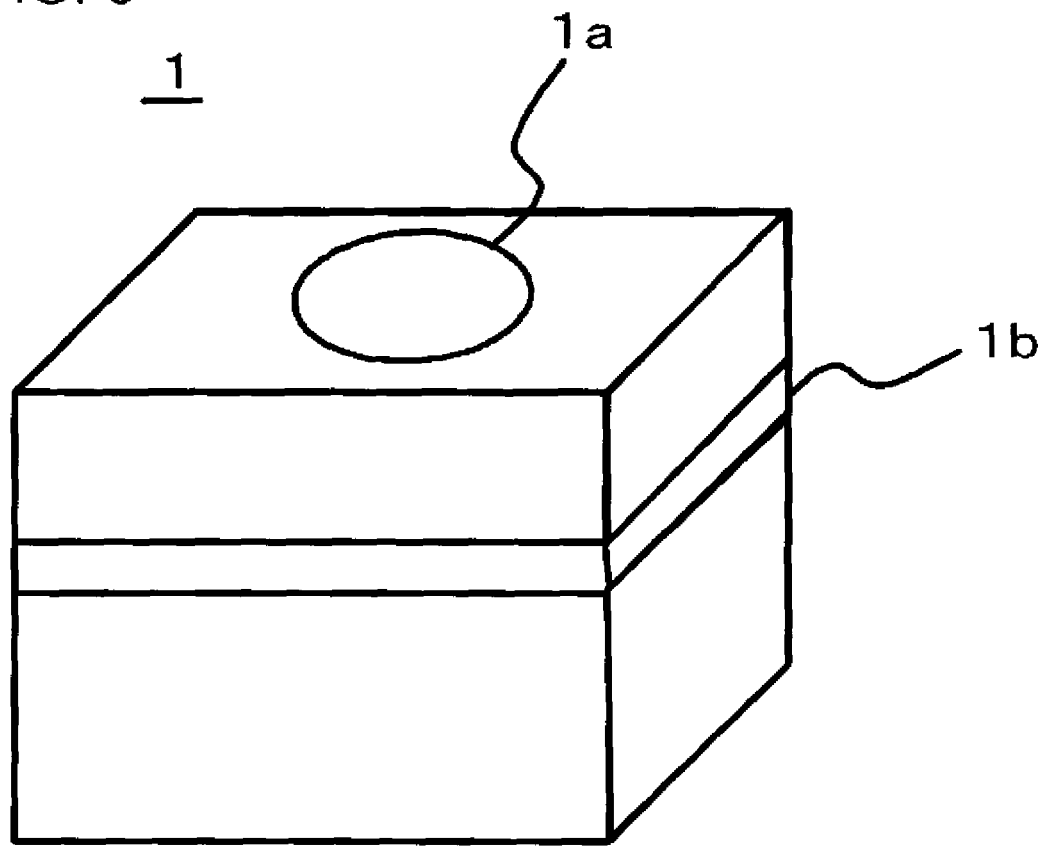
FIG. 6 is a perspective view illustrating a configuration of a general light emitting element.

FIG. 6 is a perspective view illustrating an exemplary configuration of the light emitting element 1. As illustrated in FIG. 6, the light emitting element 1 typically has an electrode 1a (electrode pad) on the upper surface thereof, and an back electrode (not illustrated) on the lower surface (back surface) thereof. The light emitting element 1 has also a PN junction 1b as a light emitting portion. The thus-configured light emitting element 1 emits light from the outer surface of the light emitting element 1.

The light receiving element 2 typically has, on the upper surface thereof, electrodes 2a and a light receiving area 2b. The light receiving element 2 receives the light, which is emitted from the light emitting element 1 and transmitted through the optical waveguide 3, in the light receiving area 2b.

As illustrated in FIG. 1 and FIG. 2, the light emitting element 1 and the light receiving element 2 are disposed typically on the same plane. More specifically, the light emitting element 1 is disposed on a package terminal 7, typically so that the back electrode thereof is brought into electrical contact with the package terminal (base) 7. On the other hand, the light receiving element 2 is disposed on a separate package terminal 7 different from that having the light emitting element 1 disposed thereon. An electrode 1a of the light emitting element 1 and electrodes 2a of the light receiving element 2 are electrically connected respectively through bonding wires 6 to the separate package terminals 7. The package terminal 7 having the electrode 1a of the light emitting element 1 connected thereto, and the package terminal 7 having the electrodes 2a of the light receiving element 2 connected thereto, are electrically isolated from each other. And the package terminal 7 having the back electrode of the light emitting element 1 connected thereto, and the package terminal 7 having the electrodes 2a of the light receiving element 2 connected thereto, are electrically isolated from each other. As a consequence, the light emitting element 1 and the light receiving element 2 are electrically isolated from each other. Note that each package terminal 7 may be composed of a part of a single lead frame 5 as described later.

The optical waveguide 3 is typically composed of a body 30 formed into a flat plate, a first bonding portion 31 which connects the body 30 and the light emitting element 1, and a second bonding portion 32 which connects the body 30 and the light receiving area 2b of the light receiving element 2. The body 30 is provided so as to extend from the light emitting element 1 to the light receiving element 2, respectively through the first and second bonding portions 31, 32. In the optical waveguide 3, the first bonding portion 31 allows therethrough transmission of light from the light emitting element 1 to the body 30, the body 30 allows therethrough transmission from the first bonding portion 31 to the second bonding portion 32, and the second bonding portion 32 allows therethrough transmission from the body 30 to the light receiving element 2, in sequence.

The body 30 is composed of a light-transmissive and insulating film preliminarily molded. This sort of film may be exemplified by polyimide film. The body 30 is provided so as to extend from the first bonding portion 31 to the second bonding portion 32. The lower surface of the body 30 is opposed to the light receiving area 2b of the light receiving element 2.

The first bonding portion 31 is typically configured by dropping a light-transmissive, insulating and liquid-form resin having a high viscosity (simply referred to as "light-transmissive resin", hereinafter) onto the light emitting element 1, followed by curing. Similarly, the second bonding portion 32 is configured by dropping the light-transmissive resin, which is similar to that composing the first bonding portion 31, onto the light receiving element 2, at least onto the portion thereof containing the light receiving area 2b, and again followed by curing. This sort of light-transmissive resin may be exemplified by thermosetting silicone resin.

The height (vertical dimension) of the first and second bonding portions 31, 32 may be adjustable, by adjusting the amount of dropping and the range of dropping of the light-transmissive resin. As illustrated in FIG. 1, for example, the light receiving element 2 is thicker (larger in the vertical dimension) than the light emitting element 1. For this reason, the surface of the light emitting element 1 opposed to the body 30 (that is, the upper surface of the light emitting element 1) and the surface of the light receiving element 2 opposed to the body 30 (that is, the upper surface of the light receiving element 2) are different from each other in the distance measured from the lower surface of the body 30. Also in this case, the first bonding portion 31 is formed higher than the second bonding portion 32, so as to make the surface of the first bonding portion 31 opposed to the body 30 and the surface of the second bonding portion 32 opposed to the body 30 aligned at the same level. In other words, the heights of the first and second bonding portions 31, 32 are respectively set, so as to make the surface of the first bonding portion 31 opposed to the body 30 and the surface of the second bonding portion 32 opposed to the body 30 aligned at the same level. As a consequence, the lower surface of the body 30 may be aligned nearly in parallel with the light receiving area 2b of the light receiving element 2. By virtue of this configuration, the efficiency of transmission of light from the body 30 through the second bonding portion 32 to the light receiving area 2b is enhanced (loss of light is reduced).

For more details, the light-transmissive resin composing the first and second bonding portions 31, 32 is respectively dropped, the body 30 is laid so as to extend between both portions of the dropped resin, and the resin is cured at both portions. As a consequence, the first bonding portion 31 mutually bonds the light emitting element 1 and the bonding portion 30, and the second bonding portion 32 mutually bonds the light receiving element 2 and the body 30.

The first bonding portion 31 is formed so as to cover the entire portion of the light emitting element 1 (but excluding the surface opposed to the lead frame 5). By virtue of this configuration, light may be emitted from all surfaces of the light emitting element 1 (but excluding the surface opposed to the lead frame 5), and may be transmitted through the first bonding portion 31 to the body 30.

The first bonding portion 31 and the second bonding portion 32 are spaced from each other, while allowing the encapsulation resin 4 to reside therebetween. By virtue of this configuration, light emitted from the light emitting element 1 is transmitted sequentially through the first bonding portion 31, the body 30 and the second bonding portion 32 to the light receiving area 2b, rather than being transmitted linearly to the light receiving element 2. Accordingly, loss of light between the first bonding portion 31 and the second bonding portion 32 may be reduced.

The encapsulation resin 4 is an insulating resin containing a light reflective inorganic particle.

As the light reflective inorganic particle, any inorganic particle, capable of reflecting light at the oscillation wavelength of the light emitting element 1, and hardly allows therethrough transmission of light having such wavelength, is preferably used.

In view of further enhancing the reflective performance of the light reflective inorganic particle, the light reflective inorganic particle preferably has an aspect ratio (dimensional ratio of short edge and long edge) of the plane geometry of 2 or larger, and more preferably 3 or larger. This is because the light reflective inorganic particle having a nearly spherical geometry may allow on the surface thereof repetitive scattering of light, and thereby allow the light to reach deep inside the encapsulation resin 4 enough to cause absorption. In contrast, by adjusting the aspect ratio of the plane geometry of the light reflective inorganic particle to 2 or larger, the light may effectively be reflected back towards the optical waveguide 3 by the light reflective inorganic particle contained in the encapsulation resin 4 in the vicinity of the boundary with the optical waveguide 3, so that the light may now be less likely to reach deep inside the encapsulation resin 4 to be absorbed there. Specific examples of the geometry of the light reflective inorganic particle include sphere, or flattened geometry such as flake, wherein the flattened geometry is preferable in view of enhancing the reflective performance of the light reflective inorganic particle.

Specific examples of the light reflective inorganic particle capable of embodying such light reflective function may be any one species of inorganic materials selected from titanium oxide, aluminum oxide, mica, aluminum nitride, and boron nitride.

The content of the light reflective inorganic particle in the insulating resin is preferably 15% by weight or more and 25% by weight or less. The content is specifically adjustable at around 20% by weight. The particle size (length of the long edge) of the light reflective inorganic particle may be adjustable to 25 nm or larger and 35 nm or smaller, for example, and more specifically 30 nm or around, for example The insulating resin containing this sort of light reflective inorganic particle may be exemplified by thermosetting epoxy resin.

The encapsulation resin 4 may additionally contain, for example, 50 to 60% by weight of silica. Silica is contained in general encapsulation resin materials, but the resin materials solely containing silica cannot effectively reflect light. For this reason, this embodiments adopts the encapsulation resin 4 containing the light reflective inorganic particle as described in the above.

The encapsulation resin 4 covers the outer surface of the optical waveguide 3, over the entire portion thereof brought into contact with none of the light emitting element 1, the light receiving element 2 and the package terminals 7. More specifically, typically as illustrated in FIG. 1 and FIG. 2, only portions of the individual package terminals 7 are exposed out from the encapsulation resin 4, and other portions of the optically coupled device 10 (the light emitting element 1, the light receiving element 2, the optical waveguide 3, the bonding wire 6, and the residual portions of the individual package terminals 7) reside in the encapsulation resin 4.

Next, a method of manufacturing the optically coupled device according to this embodiment will be explained.

FIGS. 3A to 3D are sectional views illustrating a series of steps of the method of manufacturing the optically coupled device according to this embodiment. FIGS. 4A to 4F are drawings illustrating the manufacturing steps as continued from the step illustrated in FIG. 3D, wherein FIGS. 4A, 4B and 4D are plan views, and FIGS. 4C, 4E and 4F are sectional views.

Figure 3A:
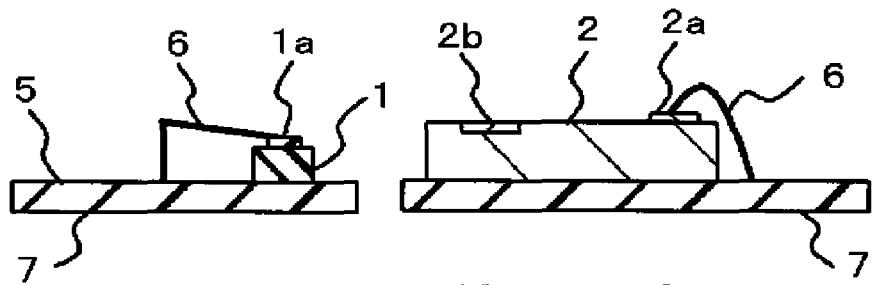
FIGS. 3A to 3D are sectional views illustrating a series of steps of a method of manufacturing the optically coupled device according to one embodiment.

First, as illustrated in FIG. 3A, on a single lead frame 5, the light emitting element 1 and the light receiving element 2 are mounted and bonded. More specifically, the light emitting element 1 and the light receiving element 2 are respectively placed on the lead frame 5, and the electrode 1a of the light emitting element 1, and the electrodes 2a of the light receiving element 2 are electrically connected respectively through the bonding wires 6 to the lead frame 5. The light emitting element 1 and the light receiving element 2 herein are disposed on the same plane. The portion having the light emitting element 1 placed thereon, the portion having the electrode 1a connected thereto, the portion having the light receiving element 2 placed thereon, and the portion having the electrodes 2a connected thereto, are separated later by cutting so as to give the separate package terminals 7.

Figure 3B:
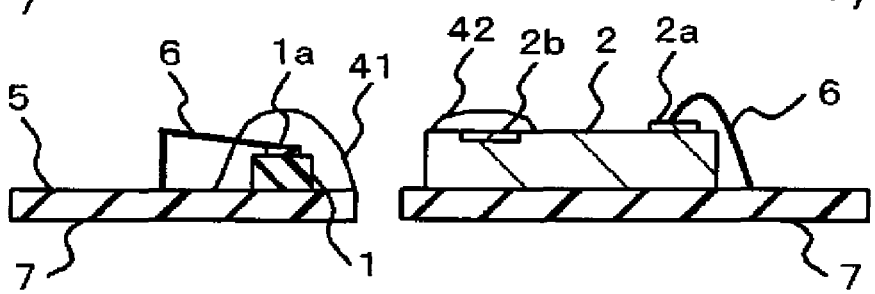

Next, as illustrated in FIG. 3B, the liquid light-transmissive resins 41, 42 are dropped respectively onto the light emitting element 1 and the light receiving element 2. The light-transmissive resins 41, 42 respectively configure the first bonding portion 31 and the second bonding portion 32, by cured later (see FIG. 3C). In this embodiment, the light receiving element 2, for example, is thicker (larger in the vertical dimension) than the light emitting element 1, so that the individual amounts of dropping and the ranges of dropping of the light-transmissive resins 41, 42 are set, so as to make the surface of the first bonding portion 31 opposed to the body 30 and the surface of the second bonding portion 32 opposed to the body 30 aligned at the same level. More specifically, the amount of dropping and the range of dropping of the light-transmissive resin 42 are set so that the light-transmissive resin 42 may spread flat over the light receiving area 2b as illustrated in FIG. 3B. In contrast, the amount of dropping and the range of dropping of the light-transmissive resin 41 are set so that the light-transmissive resin 41 is built up higher than the top surface of the light emitting element 1, typically as illustrated in FIG. 3B, and so that the upper end of the light-transmissive resin 41 reaches the level equivalent to that of the upper end of the light-transmissive resin 42. In addition, the individual amounts of dropping and the ranges of dropping of the light-transmissive resins 41, 42 are set so that the first bonding portion 31 and the second bonding portion 32 are spaced from each other, so as to allow the encapsulation resin 4 (formed later) to reside later therebetween.

Figure 3C:
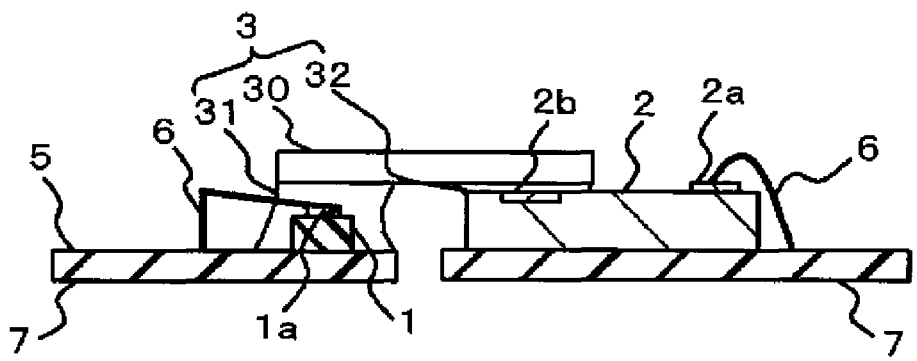

Next, the body 30 is laid so as to extend between the light-transmissive resin 41 and the light-transmissive resin 42 (see FIG. 3C). Next, as illustrated in FIG. 3C, the light-transmissive resins 41, 42 are cured typically by heat curing. As a consequence, the light-transmissive resin 41 gives the first bonding portion 31, to thereby mutually bond (adhere) the light emitting element 1 and the body 30 with each other. Similarly, the light-transmissive resin 42 gives the second bonding portion 32, to thereby mutually bond (adhere) the body 30 and the light receiving element 2 with each other. In this way, the optical waveguide 3 is configured so that the body 30 is laid so as to extend from the light emitting element 1 to the light receiving element 2, respectively placing the first and second bonding portions 31, 32 in between, to thereby make the body 30, the first bonding portion 31 and the second bonding portion 32 mutually integrated. In this way, the optical waveguide 3 which allows therethrough transmission of light from the light emitting element 1 to the light receiving element 2, electrically isolated from each other, is provided.

Next, a formwork (a die: not illustrated) is placed on the optically coupled device 10 so as to surround a predetermined portion (including the light emitting element 1, the light receiving element 2, the optical waveguide 3, the bonding wire 6, and portions of the individual package terminals 7), and the resin which composes the encapsulation resin 4, that is the resin containing a light reflective inorganic particle, is injected into the formwork. The injected resin is then cured typically by heat curing. In this way, the encapsulation resin 4 is formed typically as illustrated in FIG. 3D.

Figure 3D:
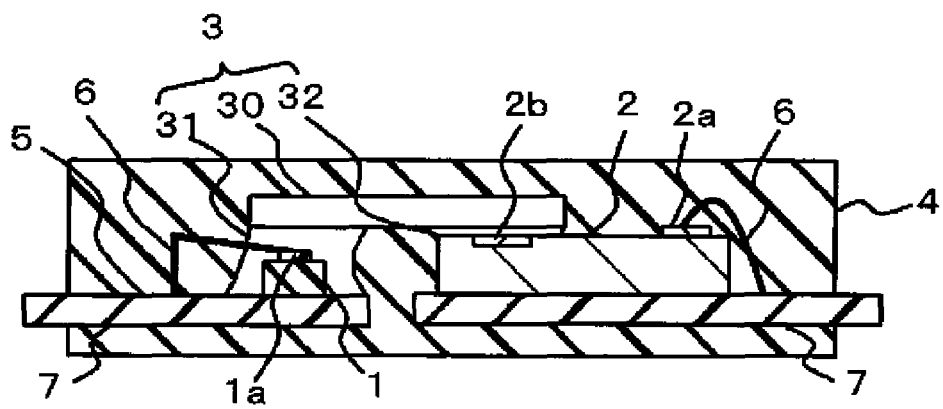

FIG. 4A is a plan view illustrating an overall geometry of the lead frame 5 in the state illustrated in FIG. 3D. Note that the encapsulation resin 4 in FIG. 4A is outlined by a virtual line (two dot-dashed line) so as to allow seeing through the encapsulation resin 4.

Next, as illustrated in FIG. 4B and FIG. 4C, the lead frame 5 is cut at positions a and b, to thereby remove the circumferential portion of the lead frame 5. The residual portions of the lead frame 5 remained after cutting at the positions a and b, that is, the portions partially embedded in the encapsulation resin 4 are given as the package terminals 7.

Next, as illustrated in FIG. 4D and FIG. 4E, the individual package terminals 7 are bent at positions c, d, e and f, to thereby give the finished form as illustrated in FIG. 4F.

The optically coupled device 10 is thus manufactured as described in the above.

Paragraphs below will explain operations of the optically coupled device 10.

Figure 5A:
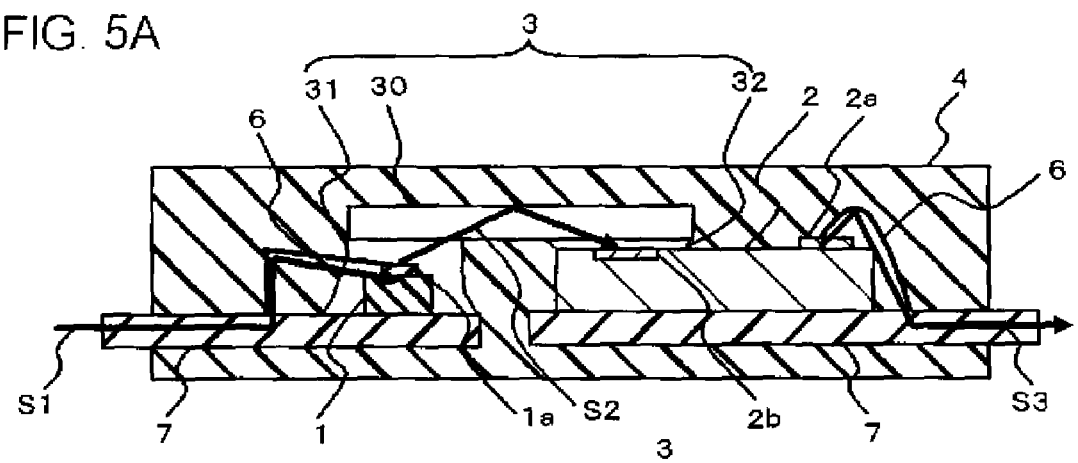
FIGS. 5A and 5B are drawings schematically illustrating modes of transmission of signals (electric signal and optical signal) by the optically coupled device according to one embodiment.
Figure 5B:
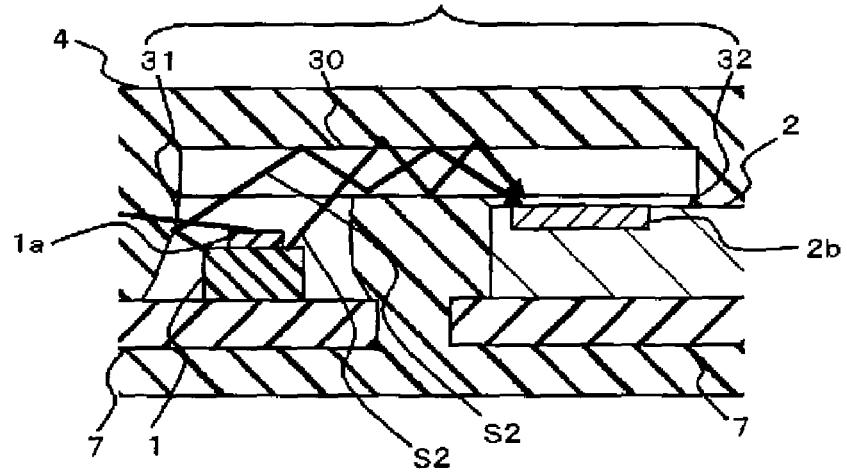

FIG. 5 is a drawing schematically illustrating modes of transmission of signals (electric signal and optical signal) by the optically coupled device 10, wherein FIG. 5A illustrates an overall flow of a signal in the optically coupled device 10, and FIG. 5B illustrates a flow of an optical signal in the optical waveguide 3.

The light emitting element 1 operates to emit light according to an electric signal S1 (FIG. 5A) input through the package terminal 7 on the light emission side (the package terminal 7 connected to the electrode 1a of the light emitting element 1) and through the bonding wire 6 to the light emitting element 1. More specifically, the light emitting element 1 converts the electric signal, input through the package terminal 7, into an optical signal, and outputs the optical signal S2 (FIGS. 5A, 5B) to the first bonding portion 31 of the optical waveguide 3.

The optical signal S2 output by the light emitting element 1 is transmitted sequentially through the first bonding portion 31, the body 30, and the second bonding portion 32 to the light receiving area 2b of the light receiving element 2. In other words, the optical waveguide 3 which is composed of the first bonding portion 31, the body 30 and the second bonding portion 32, optically couples the light emitting element 1 and the light receiving area 2b of the light receiving element 2.

As described in the above, since the package terminal 7 having the light emitting element 1 connected thereto, and the package terminals 7 having the light receiving element 2 connected thereto are electrically isolated from each other, so that also the light emitting element 1 and the light receiving element 2 are electrically isolated from each other, while only the optical signal S2 is transmittable from the light emitting element 1 through the optical waveguide 3 to the light receiving element 2. Since the encapsulation resin 4, the film composing the body 30, and the light-transmissive resin composing the first and second bonding portions 31, 32 are insulators, so that electric isolation between the light emitting element 1 and the light receiving element 2 may be ensured, even if a large potential difference should arise between the package terminal 7 on the light emitting element 1 side and the package terminals 7 on the light receiving element 2.

The optical waveguide 3 is covered with the encapsulation resin 4 which is composed of the resin containing a light reflective inorganic particle, and can thereby transmit therethrough the optical signal S2 at a high transmission efficiency.

The light receiving element 2 converts the optical signal S2, which is received at the light receiving area 2b, into an electric signal S3 (FIG. 5A), and outputs the electric signal S3 through the electrodes 2a. The electric signal S3 is output through the bonding wire 6 and the package terminals 7 to the external of the optically coupled device 10.

Since the optically coupled device 10 of the above-described embodiment is configured to have the light emitting element 1 and the light receiving element 2 which are electrically isolated from each other, the optical waveguide 3 allowing therethrough transmission of light from the light emitting element 1 to the light receiving element 2, and the encapsulation resin 4 which covers at least a part of the outer surface of the optical waveguide 3 and contains the light reflective inorganic particle, so that light in the optical waveguide 3 may desirably be confined therein by contribution of the encapsulation resin 4, and thereby the light may desirably be transmitted from the light emitting element 1 through the optical waveguide 3 to the light receiving element 2.

The optically coupled device 10 may now be provided at a lower price as compared with the optically coupled device provided with expensive holographic elements. In addition since the number of manufacturing steps may be reduced, as compared with manufacturing of the optically coupled device configured to have the optical waveguide covered with the light interceptor which has the plated layer or the resin layer preliminarily formed thereon, so that the optically coupled device 10 may be more readily manufacturable, and may therefore be provided again at a low price. The optically coupled device 10 may also be thinned as compared with the conventional one having the light emitting element and the light receiving element opposed to each other, while keeping a hollow space therebetween. In short, according to this embodiment, it is now possible to provide the thin optically coupled device 10 at a low price.

Since the light emitting element 1 and the light receiving element 2 are respectively provided on the package terminals 7 which are assumed as the base, and over the entire portion of the outer surface of the optical waveguide 3, brought into contact with none of the light emitting element 1, the light receiving element 2 and the package terminals 7, is covered with the encapsulation resin 4 containing the light reflective inorganic particle, so that the transmission efficiency of light of the optically coupled device 10 may be enhanced.

Figure 7:
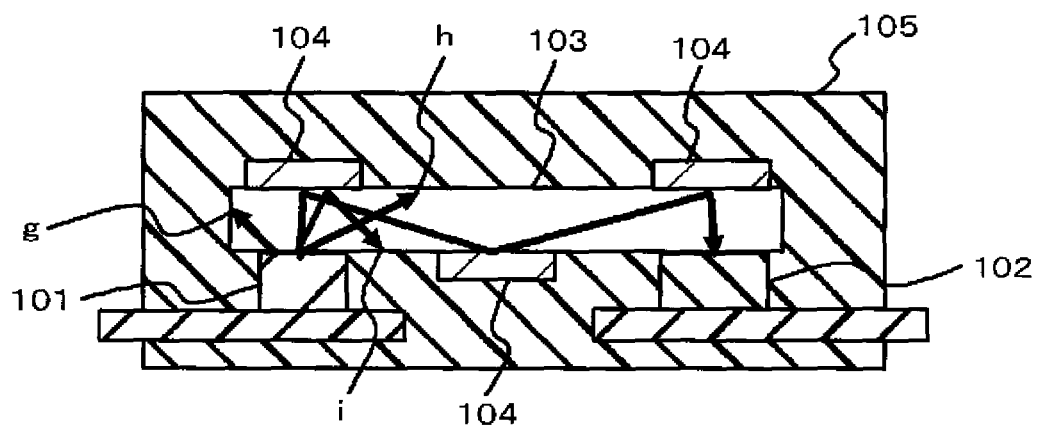
FIG. 7 is a sectional view illustrating an optically coupled device disclosed in Published Japanese Translation of PCT International Publication for Patent Application No. H09-510835.

Referring now back to Published Japanese Translation of PCT International Publication for Patent Application No. H09-510835, the optically coupled device disclosed in the Publication suffers from a problem such that light irradiated or reflected on the portions not covered by the holographic elements 104 (portions indicated by symbols g, h, i and so forth in FIG. 7) is absorbed by the package 105, enough to degrade the transmission efficiency of light. In particular, general and inexpensive light emitting element (Light Emitting Diode (LED)) lacks directionality of light, and has the electrode 1a disposed on the top surface of the light emitting element 1, typically as illustrated in FIG. 6, only to give a poor emission efficiency of light in the direction right above the light emitting element 1. For this reason, in the configuration disclosed in the Publication, the emission efficiency of light may distinctively degrade, if the light emitting element 1 is configured to have the electrode 1a disposed on the top surface thereof.

In the optically coupled device disclosed in Japanese Laid-Open Patent Publication No. H06-37352, only the top surface of the light-transmissive optical waveguide plate is covered with the reflective surface which is formed by plating or by printing of a highly-reflective resin, but the side faces of the light-transmissive guide plate are not covered with this sort of reflective surface. For this reason, light may be absorbed by the light interceptor on the side faces of the light-transmissive guide plate, again raising a problem of poor transmission efficiency of light.

Also in the optically coupled device disclosed in Japanese Laid-Open Patent Publication No. 2000-40839, light may be absorbed by the light-intercepting resin disposed around the hollow component, so that a problem of poor transmission efficiency of light remains.

In contrast, in the optically coupled device 10 of this embodiment, the encapsulation resin 4 composed of the resin containing the light reflective inorganic particle covers the entire portion of the outer surface of the optical waveguide 3, brought into contact with none of the light emitting element 1, the light receiving element 2 and the package terminals 7. Accordingly, absorption of light in this portion may desirably be suppressed, and thereby the transmission efficiency of light may be improved. In particular, the transmission efficiency of light may distinctively be improved even for the case where the light emitted from the light emitting element 1 lacks directionality.

The encapsulation resin 4 may readily be formed, by placing a formwork around the optical waveguide 3, by filling the formwork with the resin containing the light reflective inorganic particle, and by curing the filled resin.

The optical waveguide 3 may readily be formed by dropping a light-transmissive resin, for composing the first and second bonding portions 31, 32, respectively onto the light emitting element 1 and the light receiving element 2, laying the body 30 so as to extend between the thus-dropped portions of the light-transmissive resin, and then curing the thus-dropped portions of the light-transmissive resin. The individual amounts of dropping and the ranges of dropping of the light-transmissive resin for composing the first and second bonding portions 31, 32 are set, so as to make the surface of the first bonding portion 31 opposed to the body 30 and the surface of the second bonding portion 32 opposed to the body 30 aligned at the same level. More specifically, the heights of the first and second bonding portions 31, 32 are respectively set, so as to make the surface of the first bonding portion 31 opposed to the body 30 and the surface of the second bonding portion 32 opposed to the body 30 aligned at the same level. Accordingly, even if the surface of the first bonding portion 31 opposed to the body 30 in the light emitting element 1 and the surface of the second bonding portion 32 opposed to the body 30 in the light receiving element 2 are differently distant from the body 30, the lower surface of the body 30 may be aligned nearly in parallel with the light receiving area 2b of the light receiving element 2. By virtue of this configuration, light may efficiently be transmitted from the body 30 through the second bonding portion 32 to the light receiving area 2b, especially to the light receiving area 2b, and thereby the transmission efficiency of light may be improved.

Since the first bonding portion 31 and the second bonding portion 32 of the optical waveguide 3 are spaced from each other, while allowing therebetween disposition of the encapsulation resin 4 which contains the light reflective inorganic particle, so that light from the light emitting element 1 is transmitted sequentially through the first bonding portion 31, the body 30 and the second bonding portion 32 to the light receiving area 2b, rather than being linearly transmitted towards the light receiving element 2, and thereby loss of light between the first bonding portion 31 and the second bonding portion 32 may be suppressed. As a consequence, the transmission efficiency of light which is transmitted from the light emitting element 1 to the light receiving element 2 may be improved.

Since the body 30 of the optical waveguide 3 is composed of the light-transmissive film, the body 30 may be configured at a low price.

The exemplary case explained in the embodiment in the above was such as having the encapsulation resin 4, composed of the resin containing the light reflective inorganic particle, formed so as to cover the entire portion of the outer surface of the optical waveguide 3, brought into contact with none of the light emitting element 1, the light receiving element 2 and the package terminals 7. It is, however, not always necessary for the encapsulation resin 4 to cover the entire surface. Even if so, it may be preferable that the entire portion of the outer surface of the optical waveguide 3, brought into contact with at least neither first bonding portion 31 nor the second bonding portion 32, is covered with the encapsulation resin 4.

The resin containing the light reflective inorganic particle, which was explained as a thermosetting resin in the above embodiment, may alternatively be a thermoplastic resin. More specifically, such resin containing the light reflective inorganic particle may be filled in the formwork (die) while being softened under heating, and then the resin is cooled to solidify, to thereby cover the optical waveguide 3.

The package terminals 7, which were explained in the above as portions originated from a single lead frame 5, may alternatively be configured by (portions of) separate lead frames.

The exemplary case explained in the embodiment in the above was such as having the light receiving element 2 larger in the vertical dimension (height) as compared with the light emitting element 1. The light receiving element 2 may, however, be smaller in the vertical dimension as compared with the light emitting element 1, and still alternatively, the light emitting element 1 and the light receiving element 2 may of course be equal in the vertical dimension. Also in these cases, the surfaces of the first and second bonding portions 31, 32, respectively opposed to the body 30, may preferably be aligned at the same level, by appropriately adjusting the amount of dropping and the range of dropping of the light-transmissive resin composing the first and second bonding portions 31, 32.

It is apparent that the present invention is not limited to the above embodiments, that may be modified and changed without departing from the scope and spirit of the invention.

What is claimed is:

1. An optically coupled device comprising:
a light emitting element and light receiving element electrically isolated from each other;
an optical waveguide allowing therethrough transmission of light from said light emitting element to said light receiving element; and
a resin which covers at least a part of the outer surface of said optical waveguide and contains a light reflective inorganic particle,
wherein said optical waveguide extends from said light emitting element to said light receiving element, and said optical waveguide optically directly connecting said light emitting element and said light receiving element.

2. The optically coupled device according to claim 1, wherein
said light reflective inorganic particle is a particle of at least any one species of inorganic material selected from titanium oxide, aluminum oxide, mica, aluminum nitride, and boron nitride.

3. The optically coupled device according to claim 1, wherein
each of said light emitting element and said light receiving element are provided on a base, and
the entire range of a portion of the outer surface of said optical waveguide, brought into contact with none of said light emitting element, said light receiving element and said base, is covered with said resin containing said light reflective inorganic particle.

4. An optically coupled device comprising:
a light emitting element and light receiving element electrically isolated from each other;
an optical waveguide allowing therethrough transmission of light from said light emitting element to said light receiving element; and
a resin which covers at least a part of the outer surface of said optical waveguide and contains a light reflective inorganic particle, wherein said optical waveguide comprises:
a body formed into a flat plate geometry;
a first bonding portion which connects said body and said light emitting element with each other; and
a second bonding portion connecting said body and the light receiving area of said light receiving element;
said body being provided so as to extend from said light emitting element to said light receiving element, while placing said first and second bonding portions respectively in between, and
said first bonding portion allowing therethrough transmission of light from said light emitting element to said body, said body allowing therethrough transmission of light from said first bonding portion to said second bonding portion, and said second bonding portion allowing therethrough transmission of light from said body to said light receiving element, in sequence.

5. The optically coupled device according to claim 4, wherein
the surface of said light emitting element opposed to said body, and the surface of said light receiving element opposed to said body are differently distant from said body, and
the heights of said first and second bonding portions are respectively adjusted, so as to make the surface of said first bonding portion opposed to said body and the surface of said second bonding portion opposed to said body aligned at the same level.

6. The optically coupled device according to claim 4, wherein said first bonding portion and said second bonding portion are spaced from each other, and said resin containing said light reflective inorganic particle resides between said first bonding portion and said second bonding portion.

7. The optically coupled device according to claim 4, wherein said body is composed of a light-transmissive film.

8. An optically coupled device, comprising:
a light emitting element and light receiving element electrically isolated from each other;
an optical waveguide allowing therethrough transmission of light from said light emitting element to said light receiving element, the optical waveguide comprising i) a first bonding portion located on the light emitting element, ii) a second bonding portion located on the light receiving element, and iii) a body located over the first and second bonding portions and optically connecting the first and second bondings therethrough, each of the first bonding portion, the second bonding portion, and the body respectively allowing light transmission therethrough; and a resin which covers at least a part of the outer surface of said optical waveguide and contains a light reflective inorganic particle, the resin optically separating the first and second bondings in a horizontal, lateral direction.

9. The optically coupled device according to claim 8, wherein said light reflective inorganic particle is a particle of at least any one species of inorganic material selected from titanium oxide, aluminum oxide, mica, aluminum nitride, and boron nitride.

10. The optically coupled device according to claim 8, wherein each of said light emitting element and said light receiving element are provided on a base, and the entire range of a portion of the outer surface of said optical waveguide, brought into contact with none of said light emitting element, said light receiving element and said base, is covered with said resin containing said light reflective inorganic particle.

* * * * *